United States Patent
Anderson et al.

(12) 
(10) Patent No.: US 6,646,857 B2
(45) Date of Patent: Nov. 11, 2003

(54) SEMICONDUCTOR WAFER LIFTING DEVICE AND METHODS FOR IMPLEMENTING THE SAME

(75) Inventors: Thomas W. Anderson, Livermore, CA (US); Greg S. Sexton, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 242 days.

(21) Appl. No.: 09/823,817

(22) Filed: Mar. 30, 2001

(65) Prior Publication Data

US 2002/0141133 A1 Oct. 3, 2002

(51) Int. Cl.[7] .............................................. H02H 23/00
(52) U.S. Cl. ........................ 361/234; 361/233; 361/160
(58) Field of Search ................................ 361/234, 160, 361/115, 233

(56) References Cited

U.S. PATENT DOCUMENTS 5,684,669 A * 11/1997 Collins et al. ............... 361/234

FOREIGN PATENT DOCUMENTS

| EP | 5-129421 | 5/1993 | ........... H01L/21/68 |
| EP | 06338463 | 6/1994 | ......... H01L/21/205 |
| EP | 0 680083 A2 | 4/1995 | ........... H01L/21/68 |
| EP | 0783175 A2 | 9/1997 | ........... H01L/21/00 |
| JP | 7-7072 | 10/1995 | ........... H01L/21/68 |

* cited by examiner

Primary Examiner—Stephen W. Jackson
(74) Attorney, Agent, or Firm—Martine & Penilla, LLP

(57) ABSTRACT

An apparatus and a method for lifting a wafer off of an electrostatic chuck after wafer processing operations are provided. In a specific example, a wafer lifting mechanism for controlling the lifting of the wafer off of an electrostatic chuck at a completion of processing is defined. The wafer lifting mechanism includes a pin lifter yoke that is oriented below an electrostatic chuck. The pin lifter yoke has a set of pins connected thereto, and the set of pins are configured to traverse through the electrostatic chuck and contact a bottom surface of the wafer. A link is also provided and connected to the pin lifter yoke. The link is moveable so as to cause the pin lifter yoke and the set of pins to move within the electrostatic chuck and contact the bottom surface of the wafer, and once in contact with the bottom surface of the wafer, the set of pins are capable of lifting the wafer off of the electrostatic chuck. Further included is a motor for moving the link and a force feedback system for limiting an application of force by the set of pins to the bottom surface of the wafer during the lifting. The application of force, in one example, is discontinued when a strain level grows to a level that can potentially cause damage to the wafer, such as in those cases where the wafer is still strongly adhered to the chuck with electrostatic forces.

20 Claims, 7 Drawing Sheets

SEMICONDUCTOR WAFER LIFTING DEVICE AND METHODS FOR IMPLEMENTING THE SAME

BACKGROUND OF THE INVENTION

1. Field of the Invention

The present invention relates to semiconductor fabrication equipment, and more particularly, the present invention relates to an improved mechanism for de-chucking and lifting a semiconductor wafer from a chuck that resides inside a semiconductor processing chamber.

2. Description of the Related Art

In semiconductor fabrication, integrated circuit devices are fabricated from semiconductor wafers that are placed through numerous processing operations. Many of the numerous processing operations are commonly carried out in processing chambers in which layers, such as, dielectric and metallization materials are successively applied and patterned to form multi-layered structures. For example, some of these layers (e.g., $SiO_2$) are commonly deposited in chemical vapor deposition (CVD) chambers, and then photoresist materials are spin-coated and placed through photolithography patterning. When a photoresist mask is defined over a particular surface, the semiconductor wafer is placed into a plasma etching chamber in order to remove (i.e., etch) portions of the underlying materials that are not covered by the photoresist mask.

FIG. 1A shows a semiconductor processing system 100 including a chamber 102 that is used for processing semiconductor wafers through etching operations. In this example, the chamber 102 includes a chuck 104 which is configured to support a semiconductor wafer 106. The chamber 102 is also configured to have a top electrode 114. The top electrode 114 is configured to receive processing gases which are distributed into the plasma region 112 during processing. The plasma region 112 is defined between the surface of the top electrode 114 and the surface of the wafer 106.

The top electrode 114 is also shown coupled to a match box 116a and an RF power source 118a. The chuck 104 is also coupled to a match box 116b and an RF power source 118b. The chamber 102 is provided with outlets 120 which are configured to pump out excess gases from within the chamber 102 during processing. In operation, the RF power supply 118a is configured to bias the top electrode 114 and operate at frequencies of about 27 MHz. The RF power source 118a is primarily responsible for generating most of the plasma density within the plasma region 112, while the RF power source 118b is primarily responsible for generating a bias voltage within the plasma region 112. The RF power source 118b generally operates at lower frequencies in the range of about 2 MHz.

FIGS. 1B and 1C provide a more detailed view of the chuck 104 of the semiconductor processing system 100. The chuck 104 shown in FIG. 1B is of the monopolar type in which only one positive electrode 122 is formed in dielectric material 124 and the plasma 112 potential has a negative polarity. The chuck 104 shown in FIG. 1C is of the bipolar type in which two electrodes, namely, positive electrode 130 and negative electrode 132, are formed in dielectric material 124.

As shown in FIGS. 1B and 1C, the chuck 104 contains a number of penetrations 126 through which lifting pins 128 are pneumatically actuated to lift the semiconductor wafer 106 from the chuck 104 upon completion of the processing operation. The process of removing the wafer 106 from the chuck 104 at the completion of processing is commonly referred to as a "de-chucking" process. Under optimal de-chucking processes, the wafer is simply lifted off of the chuck 104 using the pneumatic controls, and can then be removed from the processing chamber 100.

FIG. 1D presents a flowchart diagram describing a conventional de-chucking operation. FIG. 1D beings at the completion of semiconductor wafer processing 140. The wafer 106 must then be allowed to fully discharge 142 before attempting to lift it from the chuck 104. For monopolar chucks as shown in FIG. 1B, wafer discharge occurs through the plasma region, and in most systems requires approximately 120 seconds to complete with minimal residual charge on the wafer 106. For bipolar chucks 104 as shown in FIG. 1C, normal wafer discharge through the plasma 112 is supplemented by discharge through the chuck 104 which is facilitated with the bipolar electrodes. Wafer 106 discharge through the bipolar chuck typically requires approximately 10 to 180 seconds. The bipolar chuck assembly is advantageous as it minimizes the time required for wafer discharge and directly improves processing cycles and throughput. However, the discharge process commonly results in residual charges that are non-uniformly distributed throughout the wafer. As will be discussed below, the presence of residual charge whether uniform or un-uniform can lead to wafer damaging repercussions.

Upon completion of wafer discharge, FIG. 1D continues with actuation 144 of the lifting pins 128 to clear the wafer 106 from the chuck 104 and allow removal of the wafer 106 from the system. Actuation of the lifting pins (typically 3 or 4) is usually achieved through use of pneumatic force. The lifting pins 128 travel upward to contact the bottom wafer surface and lift the wafer 106 to a preset transfer height. Once at transfer height, the wafer 106 is removed 146 from the system. If another wafer 106 is to be processed, the next wafer 106 is placed 148 on the lifting pins 128, lowered 150 to the chuck 104, and the process in FIG. 1D is repeated.

Lifting of the wafer 106 from the chuck 104 occasionally results in irreparable damage to the wafer 106. This damage is usually caused through contact between the lifting pins 128 and the wafer 106. If the wafer 106 contains sufficient residual charge, which is commonly non-uniform, the wafer 106 will remain electrostatically attached to the chuck 104 when the lifting pins 128 are actuated. For pneumatically actuated lifting pins 128, the lifting pins 128 are moved with a constant non-adjustable force and velocity. Thus, when impacting an immovable wafer (e.g., attached), the lifting pins will do damage to the wafer 106. If the wafer 106 is lifted only on one side (as is know to occur), the wafer 106 will slide off of the chuck 104 and become damaged. In some cases, the wafer will actually break or will cause irreversible damage to fabricated circuitry. Also, if the pin lifting force is initially resisted by the wafer 106 through residual electrostatic attraction with the chuck 104, the wafer 106 may suddenly be released from the chuck 104 as the wafer discharge process continues while the pin lifting force is applied. This sudden release from the chuck 104 may result in projectile motion of the wafer 106 and associated damage. In other cases, if the wafer 106 contains sufficient residual charge and the lifting pins 128 are applied with sufficient force, the lifting pins may actually break through the wafer.

In view of the foregoing, what is needed is a pin lifting apparatus, and method for making and implementing the apparatus which will assist in efficiently lifting the semiconductor wafer from the chuck through the application of monitored and controlled lifting force to the backside of a wafer and provide techniques for rapid removal of resistant residual charges between the wafer and chuck.

SUMMARY OF THE INVENTION

Broadly speaking, the present invention fills these needs by providing an apparatus and method for controllably lifting a wafer off of an electrostatic chuck after a processing operation. It should be appreciated that the present invention can be implemented in numerous ways, including as a process, an apparatus, a system, a device or a method. Several inventive embodiments of the present invention are described below.

In one embodiment, in a wafer processing chamber, a wafer lifting mechanism for controlling the lifting of the wafer off of an electrostatic chuck at a completion of processing is disclosed. The wafer lifting mechanism includes a pin lifter yoke that is oriented below an electrostatic chuck. The pin lifter yoke has a set of pins connected thereto, and the set of pins are configured to traverse through the electrostatic chuck and contact a bottom surface of the wafer. A link is also provided and connected to the pin lifter yoke. The link is moveable so as to cause the pin lifter yoke and the set of pins to move within the electrostatic chuck and contact the bottom surface of the wafer, and once in contact with the bottom surface of the wafer, the set of pins are capable of lifting the wafer off of the electrostatic chuck. Further included is a motor for moving the link and a force feedback system for limiting an application of force by the set of pins to the bottom surface of the wafer during the lifting.

In another embodiment, a substrate lifting mechanism for controlling the lifting of the substrate off of an electrostatic chuck at a completion of processing is disclosed. The substrate lifting mechanism includes a pin lifter yoke having a set of pins connected thereto, and the set of pins are configured to contact a bottom surface of the substrate. A lead screw is connected to the pin lifter yoke, and a motor for moving the lead screw is provided. A force feedback system is further included. The force feedback system includes a strain gauge for determining a resistive force against the set of pins, a digital signal processor for receiving data regarding the resistive force, a motor controller for controlling the motor, and an encoder. The encoder is configured to communicate lead screw position data to the motor controller and digital signal processor.

In still another embodiment, a method for lifting a wafer off of an electrostatic chuck after the completion of a processing operation is disclosed. The method includes raising a set of pins through the electrostatic chuck toward an underside of the wafer. Contact is then achieved between the set of pins and the underside of the wafer. The method then includes applying a lifting force to the underside of the wafer and monitoring the lifting force. The lifting force is then discontinued when the monitoring indicates that a threshold level has been reached.

The advantages of the present invention are many and substantial. Most notably, by monitoring the strain on the lift pins that are in contact with the wafer during lifting, it is possible to determine when the lift pins should no longer be raised so as to prevent damage to the wafer. Once the wafer has been adequately discharged and can easily be removed from the electrostatic chuck, the lifting can then resume until the wafer has been placed to its proper up position and can then be accessed by a robot's end effector. Other aspects and advantages of the present invention will become apparent from the following detailed description, taken in conjunction with the accompanying drawings, illustrating by way of example the principles of the present invention.

BRIEF DESCRIPTION OF THE DRAWINGS

The invention together with further advantages thereof, may best be understood by reference to the following description taken in conjunction with the accompanying drawings.

DETAILED DESCRIPTION OF THE PREFERRED EMBODIMENTS

An invention is described for a semiconductor wafer lifting device that assists in de-chucking and lifting a semiconductor wafer from a chuck that resides inside a semiconductor processing chamber. In the following description, numerous specific details are set forth to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

The embodiments of the present invention disclose a semiconductor wafer lifting device that enables wafers to be efficiently discharged and safely lifted from an electrostatic chuck following chamber processing operations. Although the semiconductor wafer lifting device of the present invention can be used in many different types of processing chambers, one exemplary chamber that will benefit from the inventive design features of the disclosed wafer lifting device is a Rainbow 4520XL processing chamber, which is available from Lam Research Corporation of Fremont, Calif. In some chamber orientations, the chuck may be of monopolar or bipolar type. In either case, the semiconductor wafer lifting device of the present invention will assist in wafer discharge and de-chucking operations while overcoming the problems of the prior art.

Figure 1A:
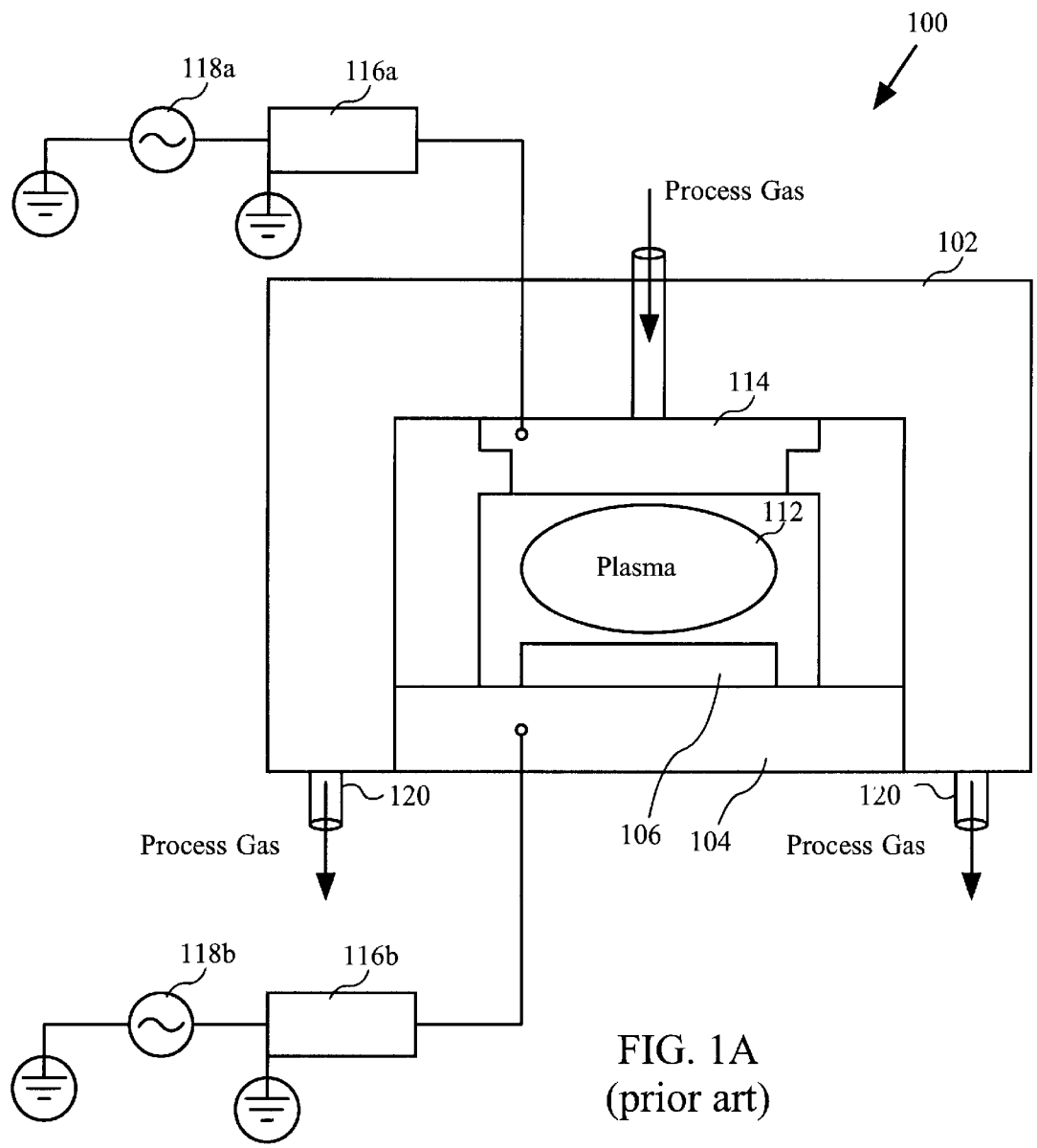
FIG. 1A shows a semiconductor processing system including a chamber that is used for processing semiconductor wafers through etching operations.
Figure 1B:
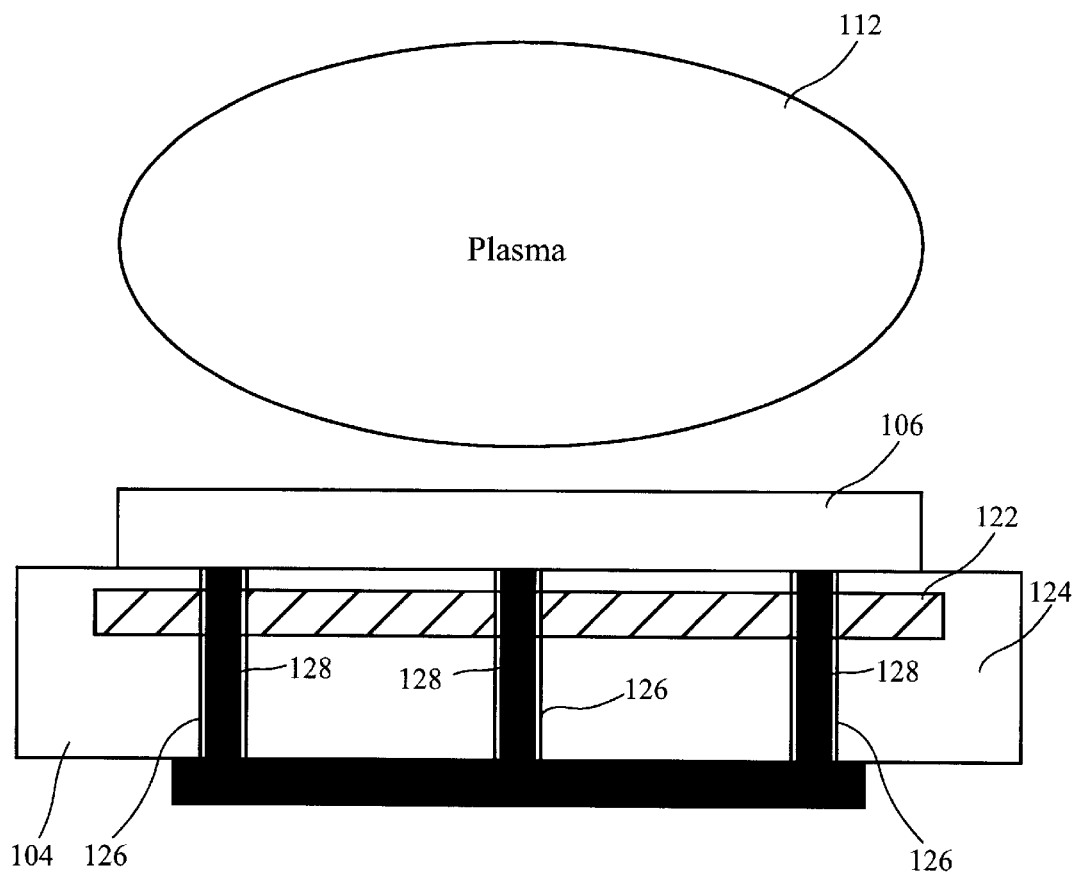
FIG. 1B provides a more detailed view of a monopolar type electrostatic chuck of a semiconductor processing system.
Figure 1C:
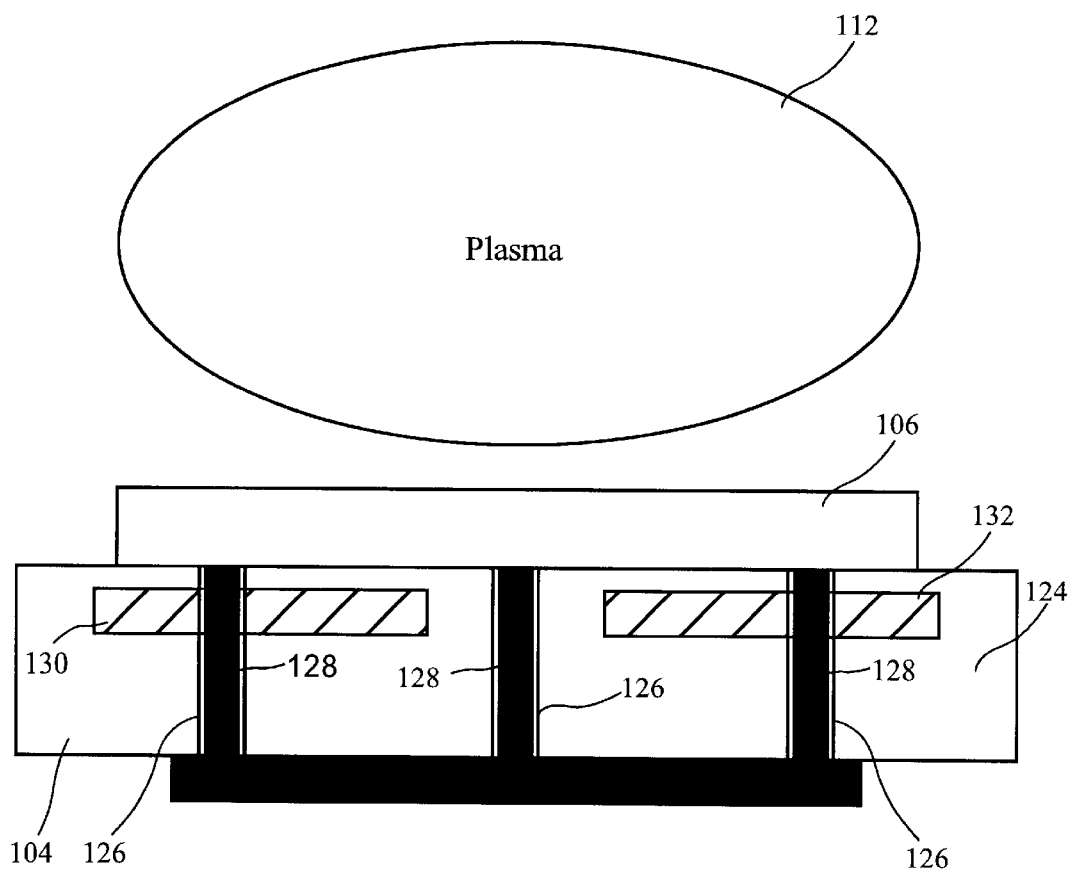
FIG. 1C provides a more detailed view of a bipolar type electrostatic chuck of a semiconductor processing system.
Figure 1D:
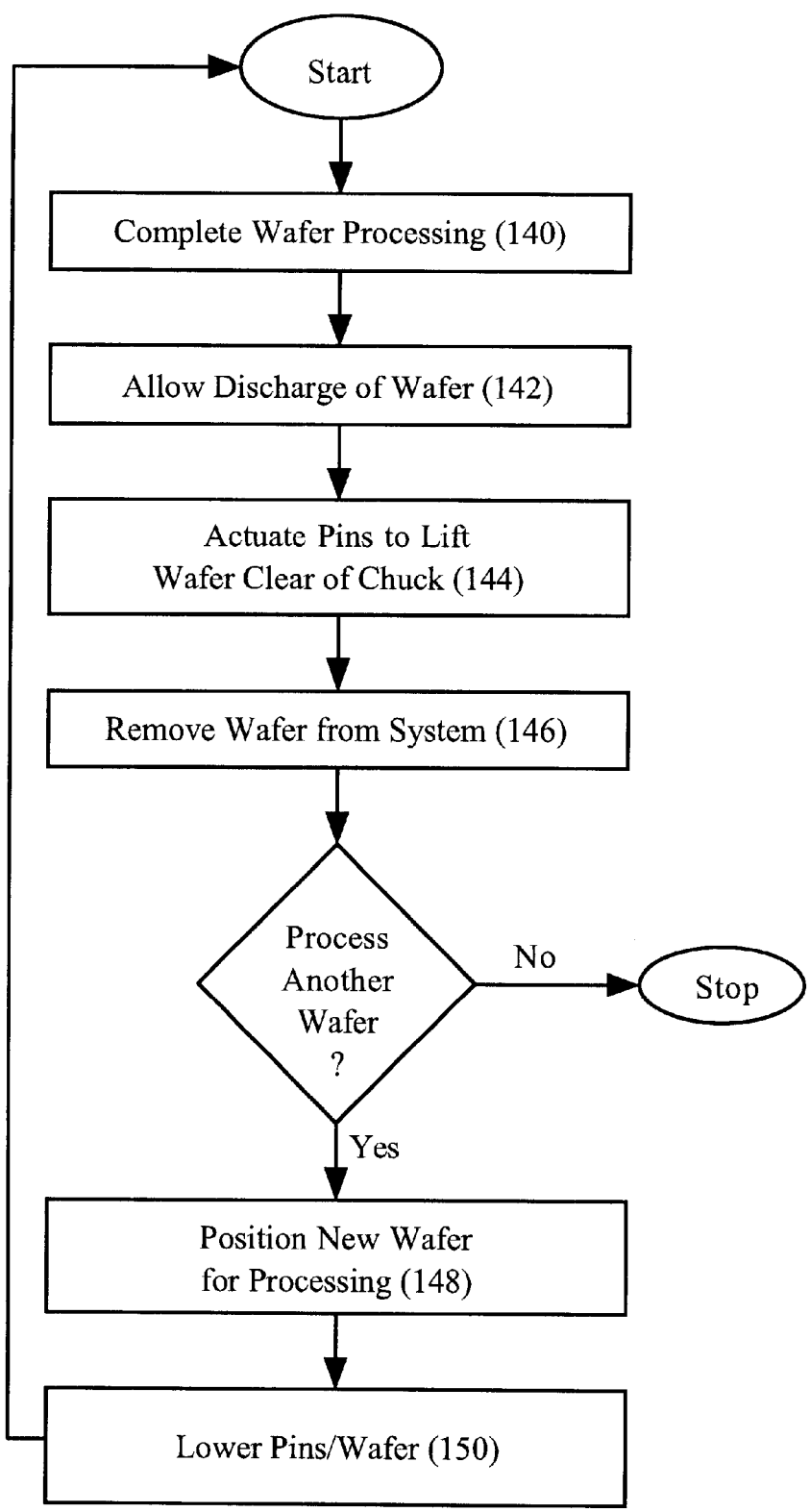
FIG. 1D shows a flow diagram of the de-chucking operation conducted in a semiconductor processing system.
Figure 2A:
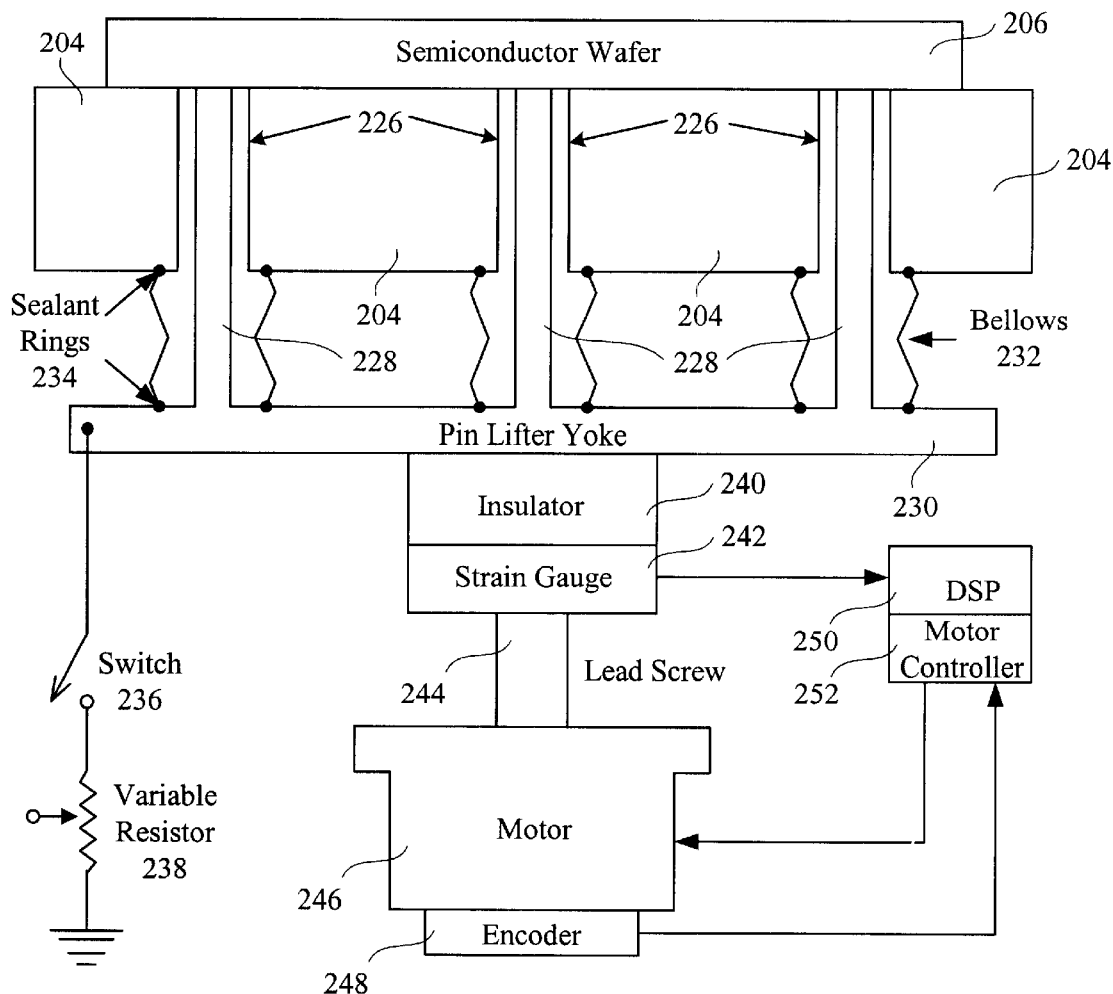
FIG. 2A shows a cross sectional view of a semiconductor wafer lifting device as the lifting pins contact the wafer surface in accordance with one embodiment of the present invention.

FIG. 2A shows a cross sectional view of a semiconductor wafer lifting device as the lifting pins 228 contact the wafer 206 under surface in accordance with one embodiment of the present invention. In this embodiment, the semiconductor wafer lifting device includes a number of conductive lifting pins 228 which traverse the electrostatic chuck 204 through a number of penetrations 226. Typically, there are either 3 or 4 lifting pins 228. However, this embodiment of the present invention is not restricted to specific number of lifting pins 228. The lifting pins 228 are connected to the lifting yoke 230 such that electrical conductance is provided. The space between the lifting pins 228 and the electrostatic chuck 204 is isolated from the space below the chuck by bellows 232 and sealant rings 234. Use of bellows 232 allows the yoke 230 to move with respect to the chuck 204 without compromising the atmospheric isolation within the processing chamber. The lifting yoke 230 is electrically connected to ground through a switch device 236 and a variable resistor 238. Electrical conductivity through the lifting pins 228, yoke 230, switch device 236, and variable resistor 238 is isolated from the remainder of the lifting device by an insulating material 240 centered about the yoke 230. A strain gauge 242 is positioned between the insulating material 240 and a lead screw 244 which is driven by a motor 246 to move the yoke 230. It should be noted that the lead screw 244 can be replaced with any type of link, so long as it is able to raise and lower the pin lifter yoke 230.

In one embodiment, the strain gauge 242 sends information signals to a digital signal processor (DSP) 250, which in turn sends signals to a motor controller 246, which in turn sends signals to the motor 246 for controlling the positioning of the lead screw 244. An encoder 248 is interfaced with the motor 246 and is configured to send signals to the motor controller 246. The information provided by the encoder 248 will contain current position data for the lead screw 244.

In a preferred embodiment of the present invention, the lifting pins 228 are configured to contact the under surface of the wafer 206 and apply a low force, such that electrical conductivity is established between the wafer and the lifting pins. The low force is designed to prevent the application of high stresses that can have the potential of damaging the wafer while it is electrostatically bonded to the chuck 204. In operation, the switch 236 will be open to allow controlled contact between the lifting pins 228 and the wafer 206. In this manner, uncontrolled electrostatic discharge will not occur until the appropriate process time has been reached. For example, once electrical conductivity is established between the wafer 206, containing residual charge, and the lifting pins 228, the switch 236 will be closed to allow controlled discharge of the wafer through the variable resistor 238 to ground. Preferably, the variable resistor 238 will be set so as to minimize the required discharge time of the wafer 206, while protecting wafer integrity.

In a preferred embodiment, the lifting yoke 230 will be moved incrementally upward to lift the wafer 206 from the chuck 204. As the lifting pins 228 experience forces resistant to lifting of the wafer 206, these forces will be transferred through the lifting yoke 230 to the strain gauge 242. The strain measurement from the strain gauge 242 will in turn be monitored by the DSP 250. If the monitored strain force ($F_s$=mass*gravity) is not within an acceptable range, the DSP 250 (and associated software, if necessary) will instruct the motor controller 252 to stop incrementing the motor and timeout to allow discharge of the wafer 206, such that electrostatic attraction between the wafer 206 and chuck 204 may be further reduced. The stopping of the incrementing, in one embodiment, occurs when a threshold value is reached. The threshold value is preferably a set value that identifies when the force applied by the lift pins has reached a level that might cause damage to the wafer. Thus, the threshold value is just below that level that might cause wafer damage, and in this manner, the wafer is protected from excessive forces when sufficient discharge has not taken its course.

In one embodiment, the acceptable strain force $F_s$ limit under gravity can range between about 1 ounce and about 5 pounds, depending on the size of the wafer. If the monitored strain force is within an acceptable range, the DSP 250 and associated software will instruct the motor controller 252 to continue incrementing the motor. During the incrementing, the encoder 248 attached to the motor 246 will monitor the position of the lead screw 244 and signal the lead screw position to the motor controller 252. The motor controller 252 will then instruct the motor 246 to stop lifting the yoke 230 when the desired lifting height is attained.

Figure 2B:
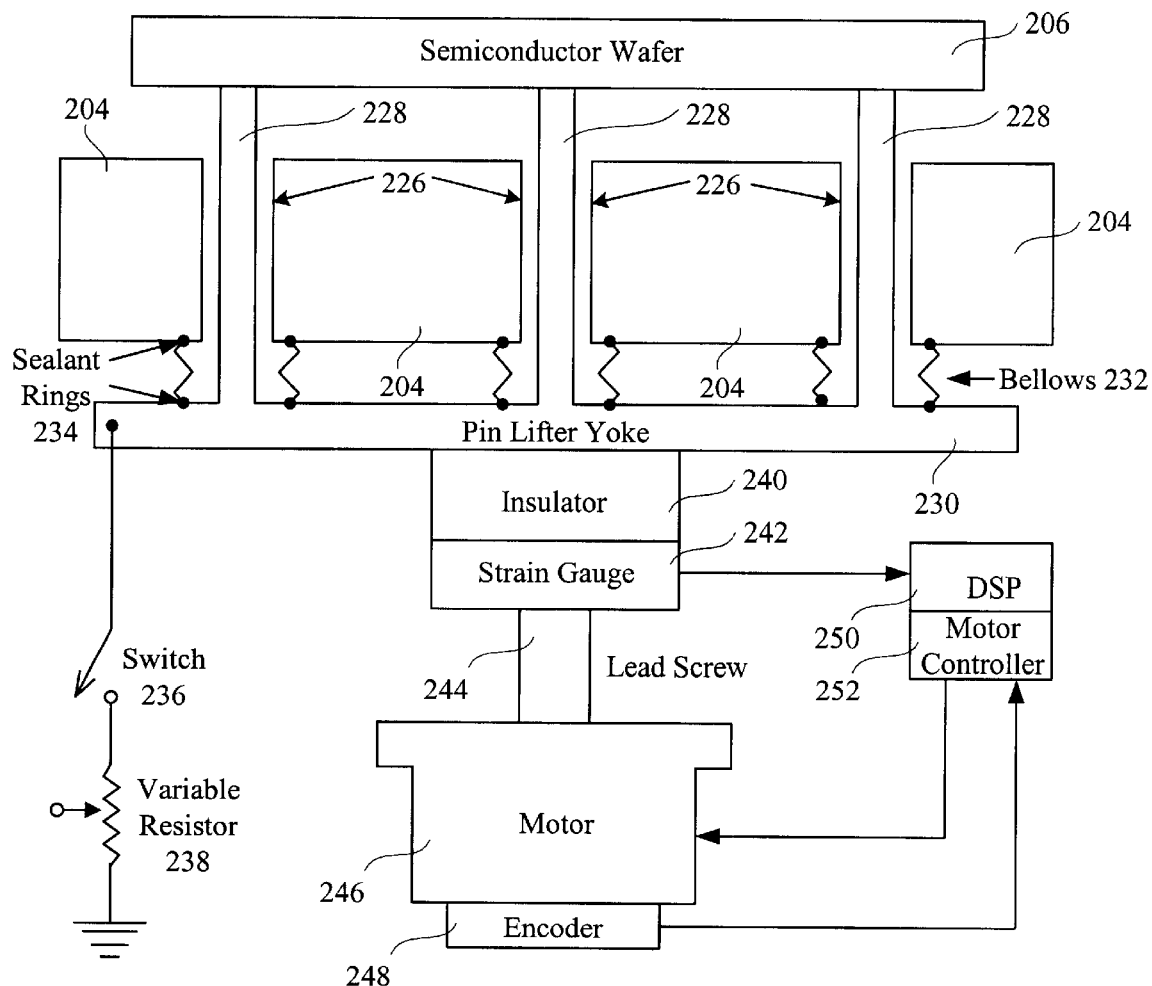
FIG. 2B shows a cross sectional view of a semiconductor wafer lifting device as the lifting pins lift the wafer in accordance with one embodiment of the present invention.

FIG. 2B shows a cross sectional view of a semiconductor wafer lifting device as the lifting pins 228 lift the wafer 206 in accordance with another embodiment of the present invention. The components shown in FIG. 2B are identical to those shown and described in FIG. 2A. FIG. 2B illustrates the movement of the lifting yoke 230 as the wafer 206 is lifted off of the chuck 204. At this point, the wafer 206 will be ready to be picked off of the lifting pins 228 by the blade of an end effector robot. Now, another wafer 206 can be placed on the lifting pins 228 so that it can be lowered onto the chuck 204 for processing.

Figure 3:
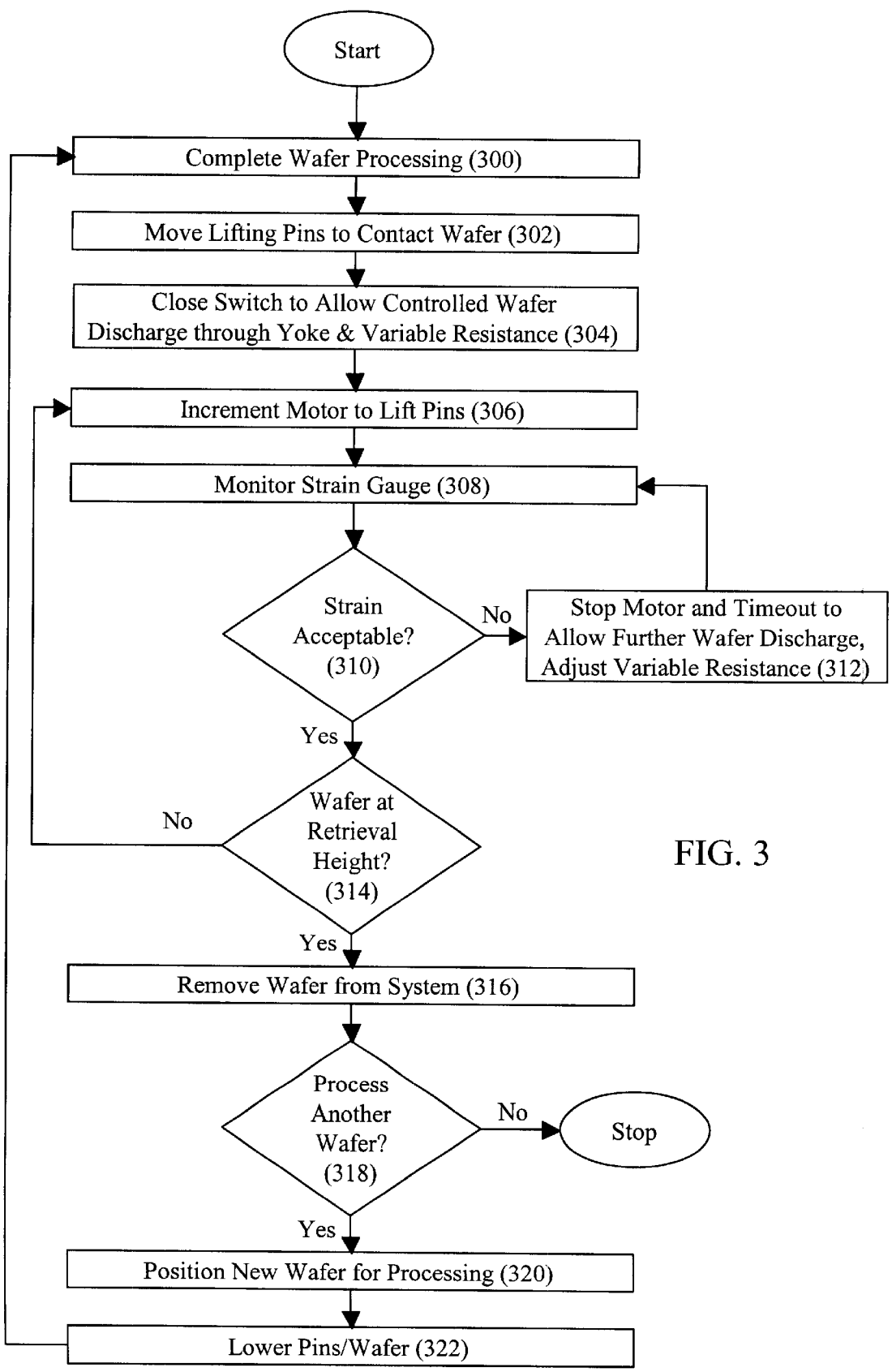
FIG. 3 shows a flow diagram of the de-chucking operation conducted using a semiconductor wafer lifting device in accordance with one embodiment of the present invention.

FIG. 3 shows a flow diagram of a de-chucking process conducted using a semiconductor wafer lifting device, in accordance with one embodiment of the present invention. FIG. 3 enters the de-chucking operation at completion of semiconductor wafer processing 300. The lifting pins are then moved 302 at low force to contact the wafer such that electrical conductivity is established without damaging the wafer at or around the lifting pin contact points. In one embodiment, the switch controlling conductivity between the lifting yoke and ground is then closed 304 to allow controlled wafer discharge to ground. A variable resistor 238, as shown in FIGS. 2A and 2B is optional, and thus, the discharge can occur directly to ground. When used, the variable resistance may be actively adjusted to control the current passing through the resistor, thus minimizing the discharge time. Once the wafer is sufficiently discharged, the motor is incremented 306 to move the lifting yoke and lift the wafer. During the lifting, the strain is measured by the strain gauge and is monitored by a DSP.

If the measured strain is not within acceptable limits 310, the motor is stopped and time is allowed for continued discharge of the wafer 312. At this point, one embodiment of the present invention allows the variable resistor to be reduced 312 to accelerate the removal of residual charges from the wafer through the lifting pins and yoke. The strain measurement and monitoring continues 308 until the strain is within acceptable limits.

If the measured strain is within acceptable limits 310, the wafer lift height is then checked 314 to determine if the wafer has reached the desired retrieval height. If the wafer has not reached the desired retrieval height, the motor is again incremented 306 to further lift the wafer. Alternatively, if the wafer has reached the desired retrieval height, the motor is no longer incremented and the wafer may be removed 316 from the processing chamber. If another wafer is to be processed, the next wafer is placed 320 on the lifting pins, lowered 322 to the chuck, and the process in FIG. 3 is repeated. Otherwise, the process in FIG. 3 is terminated.

Thus, the wafer can now be intelligently monitored for post-processing residual charges during the lifting of the wafer from a chuck. As mentioned above, the presence of too much residual charges on the wafer will create electrostatic attraction between the wafer and chuck, which will resist wafer movement when acted upon by lifting pins.

Because residual wafer charges can be rapidly removed through the lifting pins in one embodiment, the resistance to wafer movement can be rapidly and efficiently overcome.

As an advantage, the lifting mechanism of the present invention is provided a continuous feedback loop. The force feedback loop is configured to control the lifting pins only when the electrostatic attraction has been minimized so as to reduce the force needed to lift the wafer. Depending on the size of the wafer, the force feedback loop will know when enough attractive forces have been eliminated, and thus made it safe to increment the lead screw of the lifting mechanism. Without this feedback loop, a prior art system would simply lift the pins based on blind timing algorithms. Unfortunately, since electrostatic discharge is oftentimes not uniform or predictable, the prior art pneumatically controlled lift pins would crash through the wafer.

In addition, although the above described parameters are associated with a semiconductor wafer lifting device that is compatible with a Lam Research Rainbow 4520XL processing chamber, the parameters may be modified for application to other chambers and chucks, and can be used for wafers of varying sizes and shapes, such as those employed in the manufacture of semiconductor devices and flat panel displays.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a wafer processing chamber, a wafer lifting mechanism for controlling the lifting of the wafer off of an electrostatic chuck at a completion of processing, the wafer lifting mechanism comprising:
    a pin lifter yoke oriented below an electrostatic chuck, the pin lifter yoke having a set of pins connected thereto, the set of pins being configured to traverse through the electrostatic chuck and contact a bottom surface of the wafer, the pin lifter yoke including the set of pins being electrically conductive;
    a link being connected to the pin lifter yoke, the link being moveable so as to cause the pin lifter yoke and the set of pins to move within the electrostatic chuck and contact the bottom surface of the wafer, and once in contact with the bottom surface of the wafer, the set of pins being capable of both lifting the wafer off of the electrostatic chuck and shunting an electrical charge away from the wafer;
    a motor for moving the link; and
    a force feedback system for limiting an application of force by the set of pins to the bottom surface of the wafer during the lifting.

2. The wafer lifting mechanism as recited in claim 1, wherein the force feedback system further comprises:
    a strain gauge for determining the application of force by the set of pins against the bottom of the wafer;
    a digital signal processor for receiving data regarding the application of force;
    a motor controller for controlling the motor; and
    an encoder.

3. The wafer lifting mechanism as recited in claim 2, wherein the encoder is configured to communicate link position data to the motor controller and digital signal processor so that the digital signal processor can instruct the motor to delay moving the link until the application of force falls below a threshold level.

4. The wafer lifting mechanism as recited in claim 1, further comprising:
    a discharge switch, the discharge switch being coupled between the pin lifter yoke and ground.

5. The wafer lifting mechanism as recited in claim 4, wherein the discharge switch is configured to close and provide a direct path from the pin lifter yoke to ground to accelerate discharge of the electrostatic chuck.

6. The wafer lifting mechanism as recited in claim 4, further comprising:
    a resistor, the resister being coupled between the switch and ground.

7. The wafer lifting mechanism as recited in claim 6, wherein the resistor is a variable resistor.

8. The wafer lifting mechanism as recited in claim 1, wherein the link is a lead screw that is controlled by the motor.

9. A substrate lifting mechanism for controlling the lifting of the substrate off of an electrostatic chuck at a completion of processing, the substrate lifting mechanism comprising:
    a pin lifter yoke having a set of pins connected thereto, the set of pins being configured to contact a bottom surface of the substrate;
    a lead screw being connected to the pin lifter yoke;
    a motor for moving the lead screw; and
    a force feedback system, the force feedback system including,
        a strain gauge for determining a resistive force against the set of pins;
        a digital signal processor for receiving data regarding the resistive force;
        a motor controller for controlling the motor; and
        an encoder, the encoder being configured to communicate lead screw position data to the motor controller and digital signal processor.

10. The substrate lifting mechanism as recited in claim 9, wherein the digital signal processor delays the motor from moving the lead screw until the resistive force falls below a threshold level for the substrate.

11. The substrate lifting mechanism as recited in claim 9, further comprising:
    a discharge switch, the discharge switch being coupled between the pin lifter yoke and ground.

12. The substrate lifting mechanism as recited in claim 11, wherein the discharge switch is configured to close and provide a direct path from the pin lifter yoke to ground to accelerate discharge of the electrostatic chuck.

13. The substrate lifting mechanism as recited in claim 12, further comprising:
    a resistor, the resistor being coupled between the switch and ground.

14. The substrate lifting mechanism as recited in claim 13, wherein the resistor is a variable resistor.

15. A method for lifting a wafer off of an electrostatic chuck after the completion of a processing operation, the method comprising:
    raising a set of pins through the electrostatic chuck toward an underside of the wafer;

achieving contact between the set of pins and the underside of the wafer;
applying a lifting force to the underside of the wafer;
monitoring the lifting force;
discontinuing the lifting force when the monitoring indicates that a threshold level has been reached;
operating a switch to enable an electrical charge present on the wafer to be discharged to ground through the set of pins; and
adjusting a variable resistor to control the discharge of the electrical charge present on the wafer to ground.

16. A method for lifting a wafer as recited in claim 15, further comprising:
resuming the applying of a lifting force to the underside of the wafer; and
terminating the lifting force when the wafer has been raised a lift height.

17. A method for lifting a wafer as recited in claim 15, wherein the monitoring includes processing a strain value.

18. A method for lifting a wafer as recited in claim 17, wherein the strain value is used to determine whether the threshold value is reached.

19. A method for lifting a wafer as recited in claim 18, wherein the threshold value is signals a lifting force maximum that is to be applied to the backside of the wafer.

20. A method for lifting a wafer as recited in claim 15, further comprising:
enhancing a discharge of the wafer to ground by decreasing a resistance of the variable resistor.

* * * * *